(12) United States Patent
Otis (10) Patent No.: US 6,239,975 B1
(45) Date of Patent: May 29, 2001

(54) ENHANCED ARRANGEMENT FOR SUPPLYING CONTINUOUS POWER TO A CIRCUIT BOARD

(75) Inventor: Bruce Phillip Otis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/376,064

(22) Filed: Aug. 17, 1999

(51) Int. Cl.[7] .................................. G06F 1/16; H05K 7/14
(52) U.S. Cl. ..................... 361/727; 361/724; 361/683; 361/825; 312/223.2
(58) Field of Search ..................................... 361/683, 686, 361/724–727, 648–651, 825, 827; 312/223.1–223.3

(56) References Cited

U.S. PATENT DOCUMENTS

| | | | |
|---|---|---|---|
| 4,158,220 | * | 6/1979 | Yamamoto et al. ................. 361/686 |
| 4,845,589 | * | 7/1989 | Weidler et al. ..................... 361/727 |
| 4,972,298 | * | 11/1990 | Casa et al. ........................ 361/727 |
| 5,101,080 | * | 3/1992 | Ferenc ............................. 361/650 |
| 5,532,907 | * | 7/1996 | Asselta et al. ..................... 361/775 |
| 5,801,921 | * | 9/1998 | Miller ............................. 361/686 |
| 5,825,615 | * | 10/1998 | Ohara ............................. 361/683 |
| 5,969,938 | * | 10/1999 | Byrne et al. ...................... 361/727 |

FOREIGN PATENT DOCUMENTS

2072954A * 10/1981 (GB) .............................. H05K/7/14

* cited by examiner

*Primary Examiner*—Leo P. Picard
*Assistant Examiner*—Lisa Lea-Edmonds
(74) *Attorney, Agent, or Firm*—Robert H. Berdo, Jr.

(57) ABSTRACT

An electrical interface arrangement includes a first buss bar, and a feed through connector fixed to the first buss bar. A second buss bar extends through the feed through connector, and is slidable relative thereto. The feed through connector electrically couples the first buss bar to the second buss bar as the second buss bar is slid through the feed through connector.

30 Claims, 9 Drawing Sheets

ENHANCED ARRANGEMENT FOR SUPPLYING CONTINUOUS POWER TO A CIRCUIT BOARD

BACKGROUND OF THE INVENTION

1. Field of the Invention

The present invention relates to an enhanced arrangement for supplying continuous power to a circuit board, and in particular, to an enhanced arrangement for supplying continuous power to a circuit board disposed in drawer, using a movable buss bar and a feed-through connector.

2. Background Information

Backplanes are wiring boards used, for example, in computers, and are typically provided with card slots or plugs for receiving various circuit boards, such as a processor card and a so-called memory riser card, attached to a common surface of the backplane by way of the card slots or the plugs. The circuit boards and backplane typically have various electrical components located thereon (for example, the Dual In-Line Memory Modules (DIMMs) on the memory riser card), which tend to consume a substantial amount of electrical power. In order to supply the electrical components with power, it is conventional to electrically connect the backplane to an external power supply. The backplane then distributes the power received from the external power supply to the appropriate electrical components in a known manner.

In order to connect the backplane to the external power supply, it is conventional to utilize a buss bar (also known as a busbar or bus). A buss bar is typically a heavy, fixed, rigid, metallic conductor, used to carry a large current and/or to make a common connection between several circuits. The buss bar can be configured to both transmit power from the external power supply to the backplane, and serve as a ground for the backplane. Alternatively, separate buss bars may be provided, with one or more of the buss bars being used to transmit the power, and one or more further buss bars being used as a ground. The advantages of using a buss bar, as opposed to using a number of individual power transmission wires or cables, are well known to those skilled in the art. Such advantages include, for example, reduced resistance (a high resistance may disadvantageously lead to voltage swings due to current fluctuations), an organized power transmission scheme due to the elimination of the power transmission wires or cables, and a reduction in undesirable electrical noise, which may be generated when using a number of individual power transmission wires or cables.

Often, it may be desirable to access the circuit boards and/or the backplane, in order to perform system maintenance or to upgrade the computer. For example, it is conventional to remove a circuit board from the computer so that various electrical components thereon can be replaced or added to.

Further, the current trend is to make computers smaller, and hence less costly. In order to reduce the overall size of the computer, the circuit boards and backplane are packaged tightly together, thus reducing accessibility to the various components disposed thereon.

In order to provide access to the circuit boards and backplane for maintenance and upgrading, it is known to space the various circuit boards apart from each other. Although this allows more room for a technician to grasp a respective circuit board, this also disadvantageously results in an increase in size of the computer.

Alternatively, it is also known to arrange the circuit boards in an accessible location, for example, at a top of the computer. The various circuit boards can then be accessed through a removable access door disposed at the top of the computer. However, this arrangement disadvantageously prevents a stacking of computers on top of each other.

A further known configuration includes placing the backplane and circuit boards inside of a slidable drawer. When access to the backplane or circuit boards is needed, the technician merely slides the drawer open, thus allowing the various boards to be removed.

However, typically the power supply is disposed external to the drawer, due to its considerable size. Thus, connecting the backplane (which is disposed in the movable drawer) to the external power supply using a conventional rigid buss bar is problematic. That is, in order to electrically couple the conventional buss bar to the backplane, a plug-type buss bar connector may be provided, which is coupled to the backplane, for example. The plug-type buss bar connector allows the buss bar, which is coupled to the power supply, for example, to be plugged to the backplane. When the drawer is in a closed position, the buss bar has one end plugged into the plug-type buss bar connector, and another end coupled to the power supply, for example. This allows power to be supplied to the backplane via the buss bar and the connector. When the drawer is slid to an open position, the connector is moved out of engagement with the buss bar, thus interrupting the supply of power to the backplane.

However, users of many computers require their computers to remain operational at all times. That is, it is now desirable to be able to perform so-called "concurrent maintenance", i.e., maintenance that is performed without powering down the various boards of the computer. It is additionally desirable to be able to perform system upgrades while the various boards are supplied with power, i.e., the "hot plugging" of circuit boards and components. In order to accomplish this, it has been necessary to electrically couple the mother board (backplane) to the external power supply using flexible cables, rather than using a buss bar. However, as noted above, the high electrical resistance of a cable can cause voltage fluctuations due to current variations. On the other hand, wide voltage swings cannot be tolerated, since the components disposed on the various circuit boards may operate at a relatively low voltage. As such, voltage regulators are typically provided. However, using a voltage regulator in this manner disadvantageously increases the cost of the overall system. Further, power supplies in today's systems are typically limited to the power provided at the line (i.e., 20 amps, 110 volts). With system power requirements growing, and with the source of power being limited, it is desirable to increase the transforming efficiency of a power supply. However, the use of voltage regulators reduces the overall efficiency of the power regulation of the system. Thus, there is a need for a buss bar that will allow for the continuous transmission of power to the circuit boards disposed in a drawer, even when the drawer is open, thus eliminating the requirement for additional voltage regulators.

Additionally, in order to provide an efficient transfer of power, it is preferable if the buss bar is engaged with the backplane using a buss bar connector. Buss bar connectors are tailored to provide a large number of A-spots at the point of engagement with the buss bar. An A-spot is the point of contact between adjoining surfaces. Because all surfaces are defined (on a microscopic level) by a plurality of peaks and valleys, when two such surfaces are placed in contact with each other, the two surfaces will only be in contact with each other at the highest of the peaks. Further, it is generally assumed that only one A-spot can be ensured between any two adjoining surfaces, i.e., at the point where the highest peak on either of the two surfaces contacts the other surface. As will be appreciated, this point of contact is typically quite small, with the size of the A-spot being dependent on the hardness of the two contact materials, and the contact force between the two contact materials. As the hardness of the materials increases, the size of the A-spot will decrease. Inversely, as the contact force between the two contact materials increases, the size of the A-spot will increase.

Since current can only flow from one conductive material to another adjacent conductive material at the A-spots, it is apparent that a larger A-spot will advantageously have a lower resistance, thus allowing the current to pass from one material to another more freely. Similarly, increasing the number of A-spots between two conductors will effectively reduce the resistance therebetween, thus also allowing the current to pass more freely. The conventional buss bar connectors provide for a relative large number of A-spots that will engage with a buss bar at a relatively high contact force, thus ensuring adequate electrical coupling is achieved between the buss bar and the backplane.

However, the conventional plug-type buss bar connector described above does not allow a feed through arrangement of the buss bar. In particular, the conventional plug-type buss bar connector is configured to only allow the buss bar to be inserted partially therein, thus precluding its use in an arrangement where the backplane is disposed in a drawer, and continuous power is desired (i.e., when the drawer is open, the buss bar will be unplugged from the connector). However, the elimination of a buss bar connector may prevent an adequate electrical interface from being established between the buss bar and the backplane. Thus, there is a need for a buss bar connector that will allow for a feed through connection to a buss bar.

SUMMARY OF THE INVENTION

It is, therefore, a principle object of this invention to provide an enhanced arrangement for supplying continuous power to a circuit board.

It is another object of the invention to provide an enhanced arrangement for supplying continuous power to a circuit board that solves the above mentioned problems.

These and other objects of the present invention are accomplished by the enhanced arrangement for supplying continuous power to a circuit board disclosed herein.

According to one aspect of the invention, the enhanced arrangement for supplying continuous power to a circuit board includes at least one first buss bar that is coupled to a power supply. The first buss bar is preferably a heavy, fixed, rigid, metallic conductor, capable of carrying a large current. Further, the first buss bar may have a first flange and a second flange, each being disposed on an opposite end of the first buss bar. The first buss bar can be fastened to the power supply by fastening the first flange to the power supply by welding or soldering, or by using screws, rivets or bolts. Moreover, the second flange is advantageously configured to allow a feed through buss bar connector to be attached thereto in a cantilever manner, without interfering with a movement of a second buss bar through the feed through connector. For example, the second flange can be provided with an opening that is sized to allow the second buss bar to pass therethrough.

In a further exemplary aspect of the invention, the first buss bar may be provided with guide members which advantageously help to support and guide the second buss bar. For example, two guide members may be provided on a lower major surface of the first buss bar (i.e., the surface that faces the second buss bar).

The second buss bar may have a configuration similar to the first buss bar, but preferably has a width that is less than a width of the first buss bar. This will advantageously allow the second buss bar to pass through the opening, for example, formed in the second flange of the first buss bar.

Additionally, according to a further exemplary aspect of the invention, the second buss bar has a constant cross-sectional profile, and is substantially straight and smooth. This configuration will advantageously allow the second buss bar to be slidingly-coupled to the first buss bar.

In a further exemplary aspect of the invention, the second buss bar is arranged under or over the first buss bar, so that the major surfaces of the first buss bar are parallel to the major surfaces of the second buss bar. This will advantageously allow the two buss bars to be disposed relative to each other using a minimum amount of space.

In a further exemplary aspect of the invention, the feed through connector has a housing formed of an insulating material. The housing can have a variety of configurations, but in the exemplary embodiment has an essentially frusto-pyramidal shape. This configuration advantageously provides the feed through connector with a relatively large, flat base, so that the feed through connector can be more easily attached to the second flange of the first buss bar. Further, the housing has a through opening (hole) extending from the base to a top of the housing, and which defines a cavity within the housing. In the exemplary embodiment, the opening and cavity have a profile that corresponds essentially to a cross-sectional profile of the second buss bar, and which is sized slightly larger than the cross-sectional profile of the second buss bar to advantageously allow the second buss bar to slide therethrough.

The feed through connector further includes at least one conductor member disposed within the cavity. In an exemplary embodiment, the conductor member is an L-shaped metal plate defined by two legs, which are essentially perpendicular to each other, and which are formed from copper and/or nickel, for example. One leg of the plate is positioned on the outside of the housing, and under the base. This arrangement advantageously allows the leg of the plate under the base to be easily fastened, for example by bolting, screwing or welding, to the second flange of the first buss bar, thus providing for a large area of engagement therebetween. As such, the area of engagement will advantageously have a relatively low impedance.

Further, the other leg of the plate is disposed in the cavity and adjacent to an inside wall of the housing. Moreover, in the exemplary embodiment, two conductor members are provided, with their respective legs being disposed on opposite sides of the cavity, and separated from each other by a space. Thus, the conductor members are advantageously disposed to receive the second buss bar therebetween.

Additionally, in the exemplary embodiment, the two conductor members are not electrically coupled to each other. Thus, if desired, the feed through connector can advantageously be used with a laminated buss bar, with one of the conductor members being electrically coupled to one of the layers of the buss bar, and the other one of the conductor members being electrically coupled to another one of the layers of the buss bar. However, a non-laminated buss bar can likewise be used with this arrangement. Moreover, if a non-laminated buss bar is utilized, then it would also be possible to interconnect the two conductor members, for example, along the longitudinal edges of the respective legs, to form one larger conductor member that would essentially surround a periphery of the second buss bar. Such a configuration would advantageously allow for a lower impedance between the second buss bar and the feed through connector.

In order to ensure a relatively high power transfer through the feed through connector, in a further exemplary aspect of the invention, the leg disposed in the cavity, is provided with a plurality of resilient conductive contact bands, each of which projects into the cavity. The contact bands will advantageously provide for a relatively large number of A-spots between the feed through connector and the second buss bar.

Moreover, in order to provide for a larger A-spot, each contact band projects into the cavity so that a distance between contact bands disposed on opposite sides of the cavity, for example, is less than a thickness of the second buss bar. This configuration advantageously allows the contact bands to exert a substantial amount of force against the respective major surfaces of the second buss bar, for example, when the second buss bar is inserted into the feed through connector.

In a further exemplary aspect of the invention, the backplane has a number of circuit boards attached thereto, with the arrangement of the backplane and the circuit boards being disposed in a slidable drawer, that can be opened to provide access to the various boards and components therein. When the drawer is moved to an open position, the first buss bar and second buss bar advantageously remain electrically coupled to each other using the feed through connector.

The length of the second buss bar is selected to allow for the full opening of the drawer without the end of the second buss bar disengaging with the feed through connector. Moreover, the end of the second buss bar may be provided with a projecting stop member, which may abut against the base of the feed through connector when the second buss bar is fully extended, to prevent the second buss bar from being pulled through the feed through connector.

In a further exemplary aspect of the invention, an upper shield panel and a lower shield panel may be provided, to cover the first buss bar and second buss bar. The upper shield panel may be connected to the first buss bar to provide support for the first buss bar and the feed through connector. Moreover, the shield panels advantageously help protect the buss bars from debris. Further, the shield panels may be formed from an insulating material, thus preventing injury to a user or damage to other components due to inadvertent contact with the buss bars.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, and if used, the terms "upper", "lower", "front", "back", "over", "under", and similar such terms are not to be construed as limiting the invention to a particular orientation. Instead, these terms are used only on a relative basis.

As shown in FIGS. 1–5, the enhanced electrical interface arrangement for supplying continuous power to a circuit board includes at least one first buss bar 10 that is coupled to a power supply 12. The first buss bar 10 may be a heavy, fixed, rigid, metallic conductor, capable of carrying a large current, for example 100 amps or more.

According to an exemplary embodiment, the first buss bar 10 is formed of copper, which is plated with nickel or gold, for example. However, the first buss bar 10 can be formed from other materials without departing from the spirit of the invention.

In the exemplary illustrated embodiment, a plurality of separate first buss bars 10 are provided. The exemplary embodiment illustrates three separate first buss bars 10, with two of the separate first buss bars 10 being connected to the power supply 12. In the illustrated exemplary embodiment, one of the first buss bars 10 may provide 5 volts power, and another one of the first buss bars 10 may provide 3 volts power, for example. Yet another one of the separate first buss bars 10 may be connected to an external (system) ground potential, for example by being connected to a chassis 13 (shown only in FIG. 4) of a computer, to serve as a ground for a circuit board 14, such as a backplane, for example.

Alternatively, the first buss bar 10 may be a layered, for example, laminated, buss bar (not shown), which includes two or more conductive layers, separated from each other by a dielectric layer. One of the conductive layers can be connected to the power supply, with the other conductive layer being connected, for example, to the external (system) ground potential.

As shown, the first buss bar 10 has two major opposing flat surfaces, and two longitudinal edges, to define a generally flat bar having a rectangular cross-sectional profile. However, the first buss bar 10 according to the present invention is not limited to this configuration, and can have other shapes, without departing from the spirit and scope of the present invention.

According to an exemplary embodiment of the present invention, the first buss bar 10 has a first flange 16 and a second flange 18, each being disposed on an opposite end of the first buss bar 10. As shown, the flanges 16, 18 project in the same direction, and essentially at a right angle to the two major opposing flat surfaces. However, other arrangements and configurations of the flanges 16, 18 are within the scope of the present invention.

The first buss bar 10 can be fastened to the power supply 12 by fastening the first flange 16 to the power supply using screws or bolts (not shown). Alternatively, it is also contemplated that the first buss bar 10 can be held in contact with the power supply 12 using other means, i.e., with or without the use of a first flange 16, without departing from the spirit of the present invention.

Figure 1:
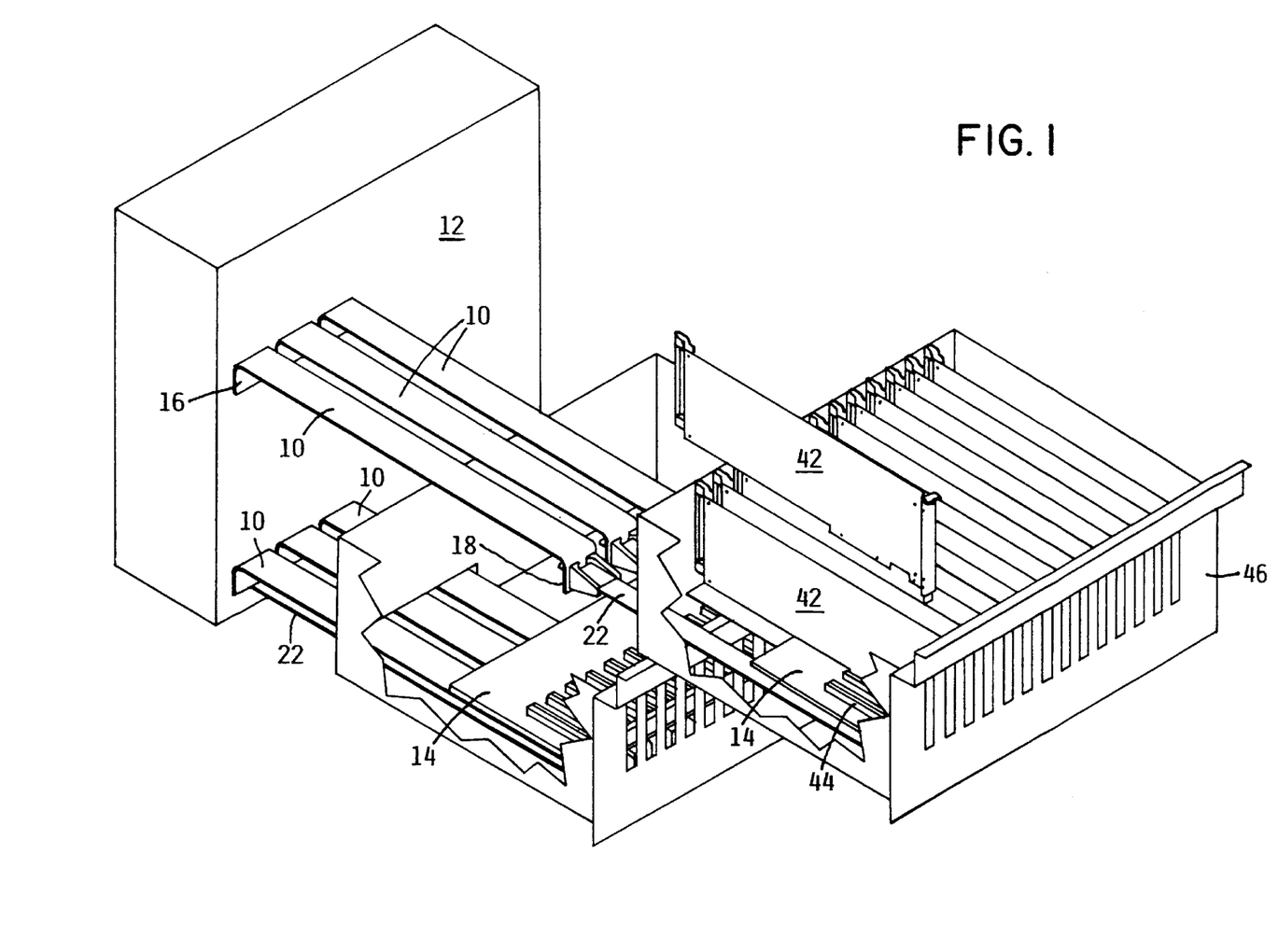
FIG. 1 is a partial, perspective illustration showing a portion of a computer, including a power supply, upper and lower drawers, and an enhanced arrangement for supplying continuous power to circuit boards disposed within the drawers, according to an exemplary embodiment of the present invention.
Figure 2:
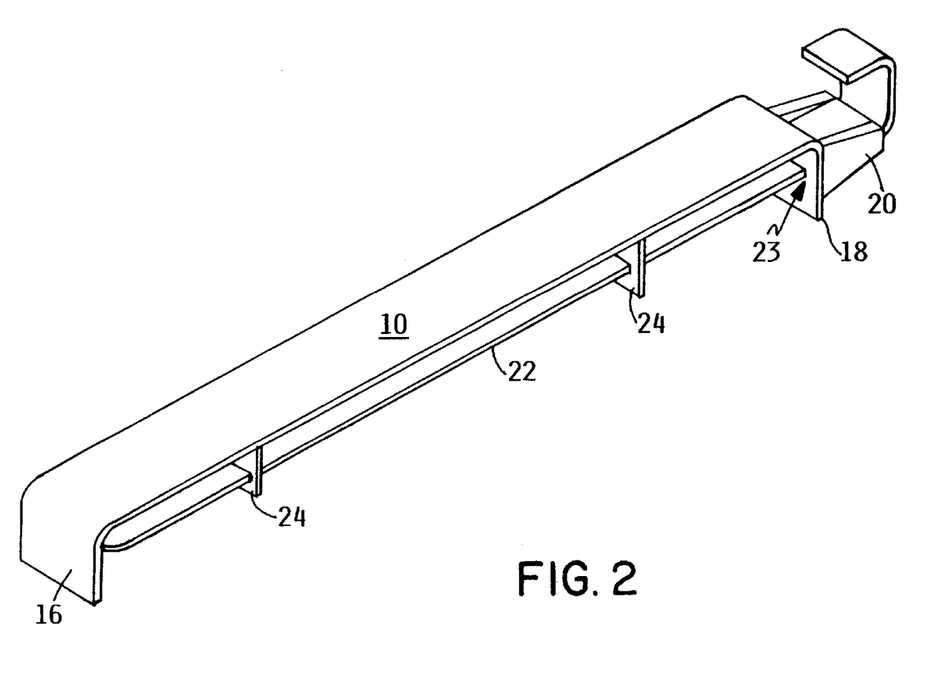
FIG. 2 is a perspective illustration of the enhanced arrangement for supplying continuous power to circuit boards shown in FIG. 1, showing only first and second buss bars, and a feed through connector.

Preferably, and referring in particular to FIG. 2, the second flange 18 is advantageously configured to allow a feed through connector 20 to be attached in a cantilever manner thereto, without interfering with a movement of a second buss bar 22 through the feed through connector 20. For example, the second flange 18 can be provided with an opening 23 that is sized to allow the second buss bar 22 to pass therethrough. Alternative configurations of the second flange 18 are also within the scope of the present invention. Moreover, it may be possible to dispense with the second flange 18 entirely, so long as the feed through connector 20 can be attached to the first buss bar 10 in a desired orientation.

As further shown in FIG. 2, the first buss bar 10 may be provided with guide members 24 which advantageously help to support and guide the second buss bar 22. In the exemplary illustrated embodiment, two guide members 24 are provided on a lower major surface of the first buss bar 10 (i.e., the surface that faces the second buss bar 22). However, more or fewer guide members, or differently configured guide members may be provided without departing from the spirit of the invention.

The second buss bar 22 preferably has a configuration similar to the first buss bar 10, and may likewise be a layered buss bar having two or more conductive layers, separated from each other by a dielectric layer. One of the conductive layers could then be connected to a power plane of the circuit board 14, with the other conductive layer being connected to a ground, for example, of the circuit board. Alternatively, and as illustrated in the exemplary embodiment, if a plurality of separate first buss bars 10 are provided, then a like number of separate second buss bars 22 are preferably likewise provided. In the illustrated exemplary embodiment, one of the second buss bars 22 is coupled to one of the first buss bars 10 to provide 5 volts power, for example, to the backplane 14, and another one of the second buss bars 22 is coupled to another one of the first buss bars 10 to provide 3 volts power, for example, to other circuits of the backplane 14. Yet another one of the separate second buss bars 22 is coupled to yet another one of the first buss bars 10, to provide a ground for the backplane 14.

As shown, the second buss bar 22 has two major opposing flat surfaces, and two longitudinal edges, to define a generally flat bar having a rectangular cross-sectional profile. However, the second buss bar 22 according to the present invention is not limited to this configuration, and can have other shapes, without departing from the spirit and scope of the present invention.

In the exemplary embodiment, the second buss bar 22 has a width (i.e., a distance between the longitudinal edges) of about 1 inch, and a thickness of about 0.125 inch. Further, preferably the width of the second buss bar 22 is less than a width of the first buss bar 10. This will advantageously allow the second buss bar 22 to freely pass through the opening 23, for example, formed in the second flange 18 of the first buss bar 10.

Additionally, according to the illustrated exemplary embodiment, the second buss bar 22 has a constant cross-sectional profile, and is substantially straight and smooth. This configuration will advantageously allow the second buss bar 22 to slide freely through opening 23 along substantially its entire length, and to be slidingly and electrically-coupled to the first buss bar 10, in a manner which will subsequently described.

Figure 3:
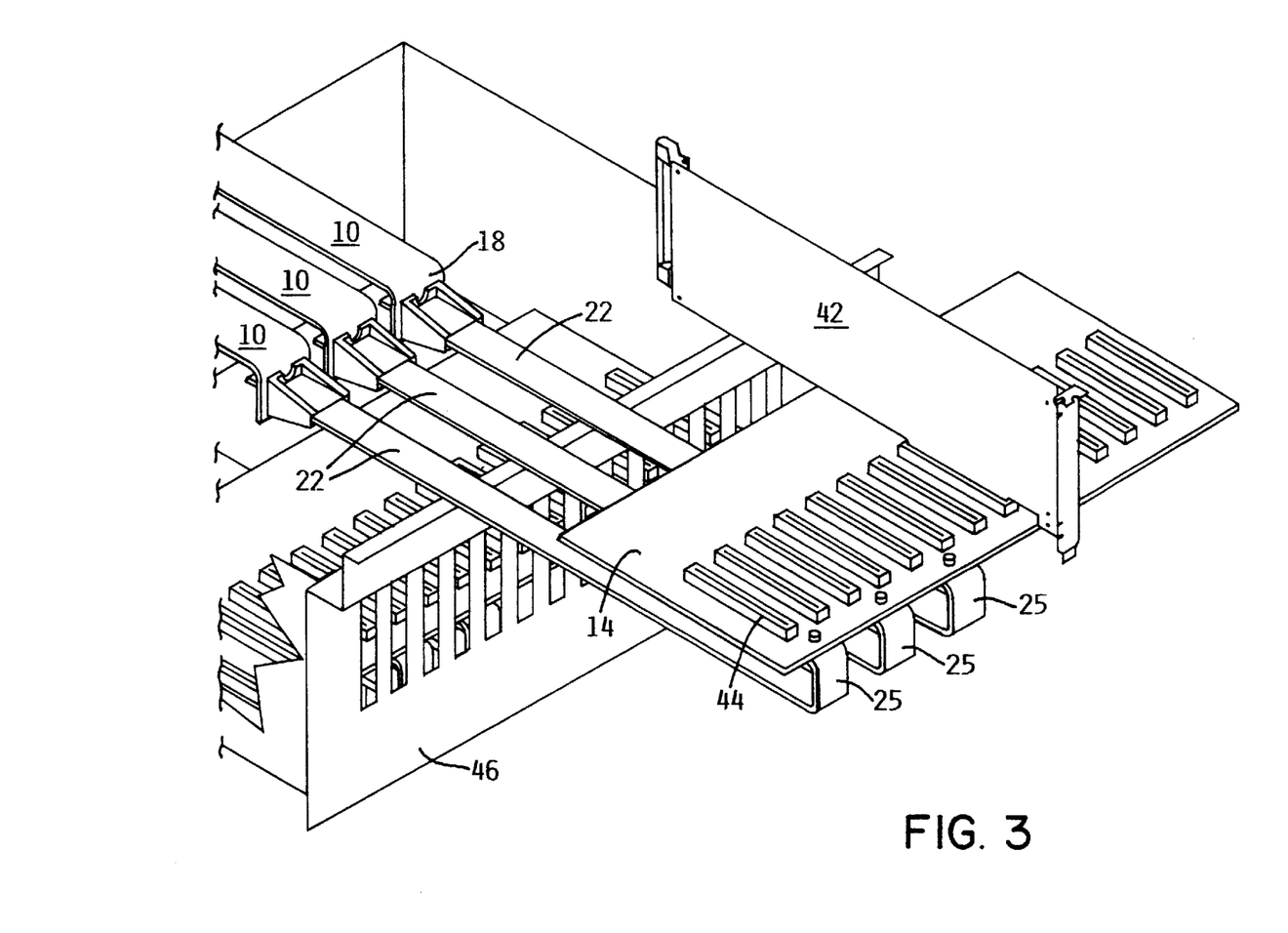
FIG. 3 is an alternative perspective illustration of the portion of the computer shown in FIG. 1, which omits the upper drawer for clarity of illustration.
Figure 4:
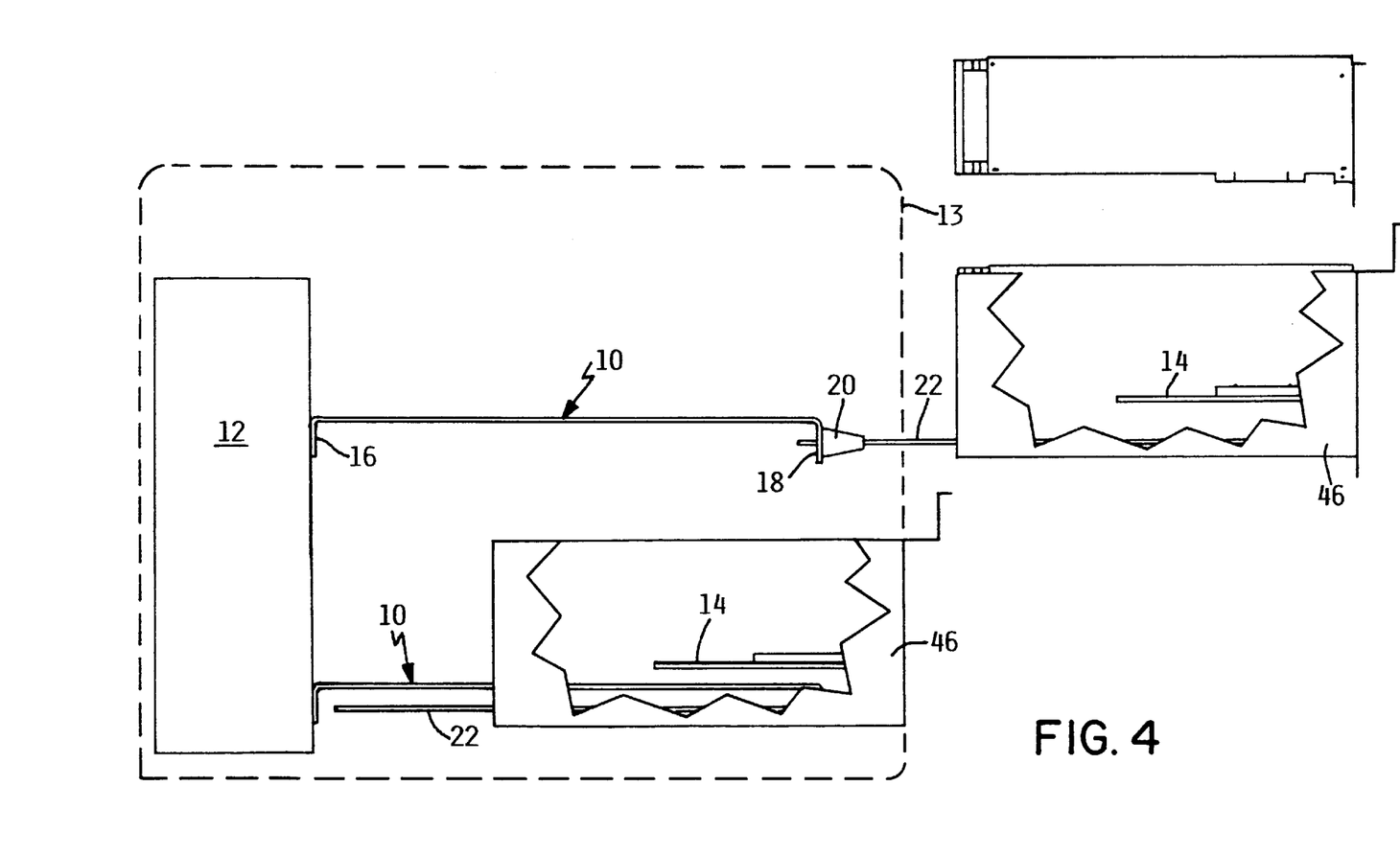
FIG. 4 is an elevational illustration of the portion of the computer shown in FIG. 1.
Figure 5:
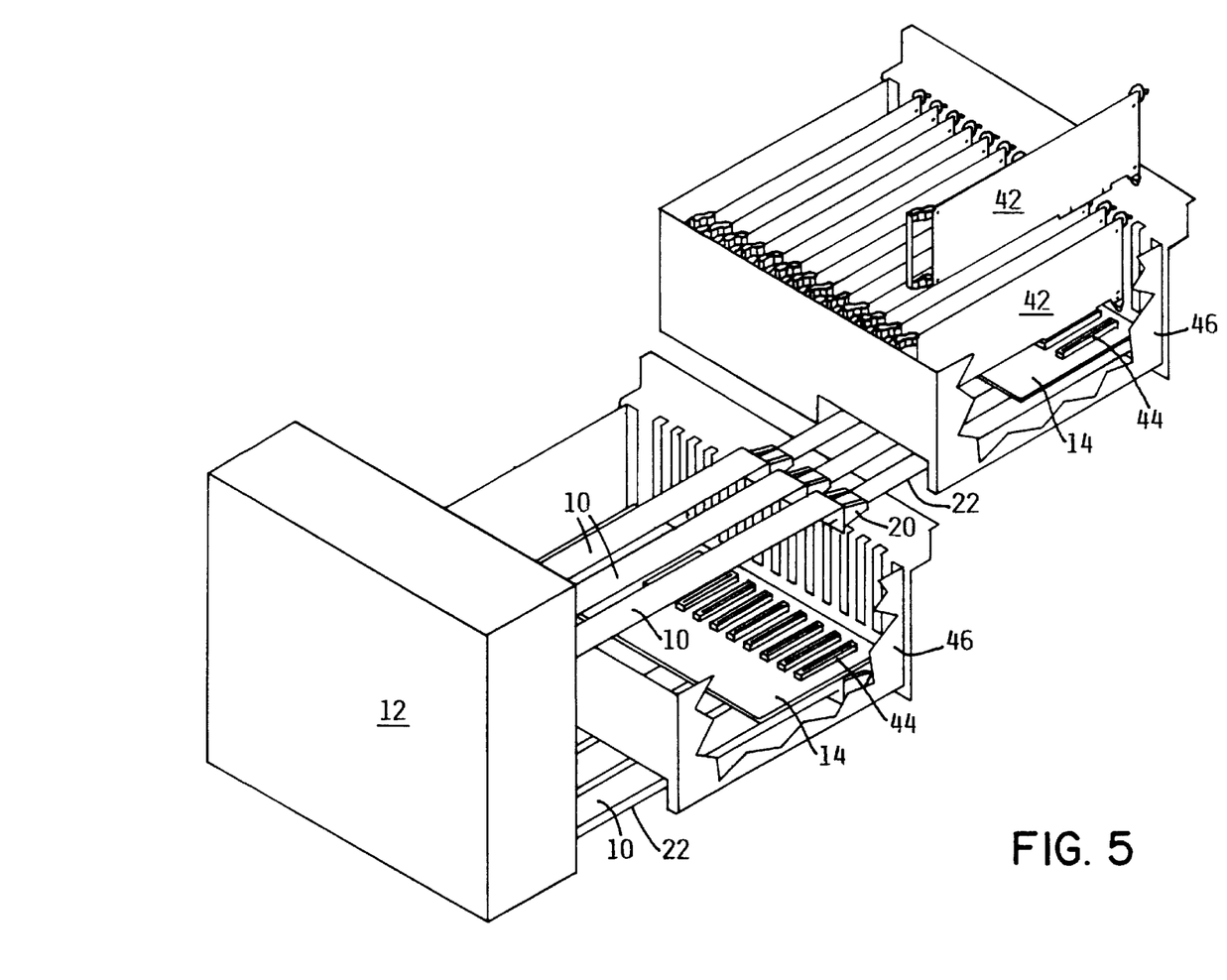
FIG. 5 is an alternative perspective illustration of the portion of the computer shown in FIG. 1.

According to an exemplary embodiment of the present invention, and as best shown in FIG. 3, the second buss bar 22 has a flange 25 disposed on an end thereof. The flange 25 projects away from the two major opposing flat surfaces, and allows the second buss bar 22 to be fastened to the backplane 14. For example, the flange 25 can be screwed, riveted or bolted to the backplane 14. Alternatively, it is also contemplated that the second buss bar 22 can be held in contact with the backplane 14 using other means, i.e., with or without the use of a flange 25, without departing from the spirit of the present invention.

As shown, the second buss bar 22 is arranged under the first buss bar 10, so that the major surfaces of the first buss bar 10 are parallel to the major surfaces of the second buss bar 22. Alternatively, the second buss bar 22 can be disposed over the first buss bar 10, or if the first and second buss bars are turned on their edges, the first and second buss bars can be disposed side-by-side. Moreover, if desired, the second buss bar 22 can be provided with a flange that accommodates the feed through connector 20 and which allows the first buss bar 10 to pass through the feed through connector without interference. In such an arrangement, it would then be preferred that the first buss bar 10 have a width that is less than the width of the second buss bar 22.

Figure 6:
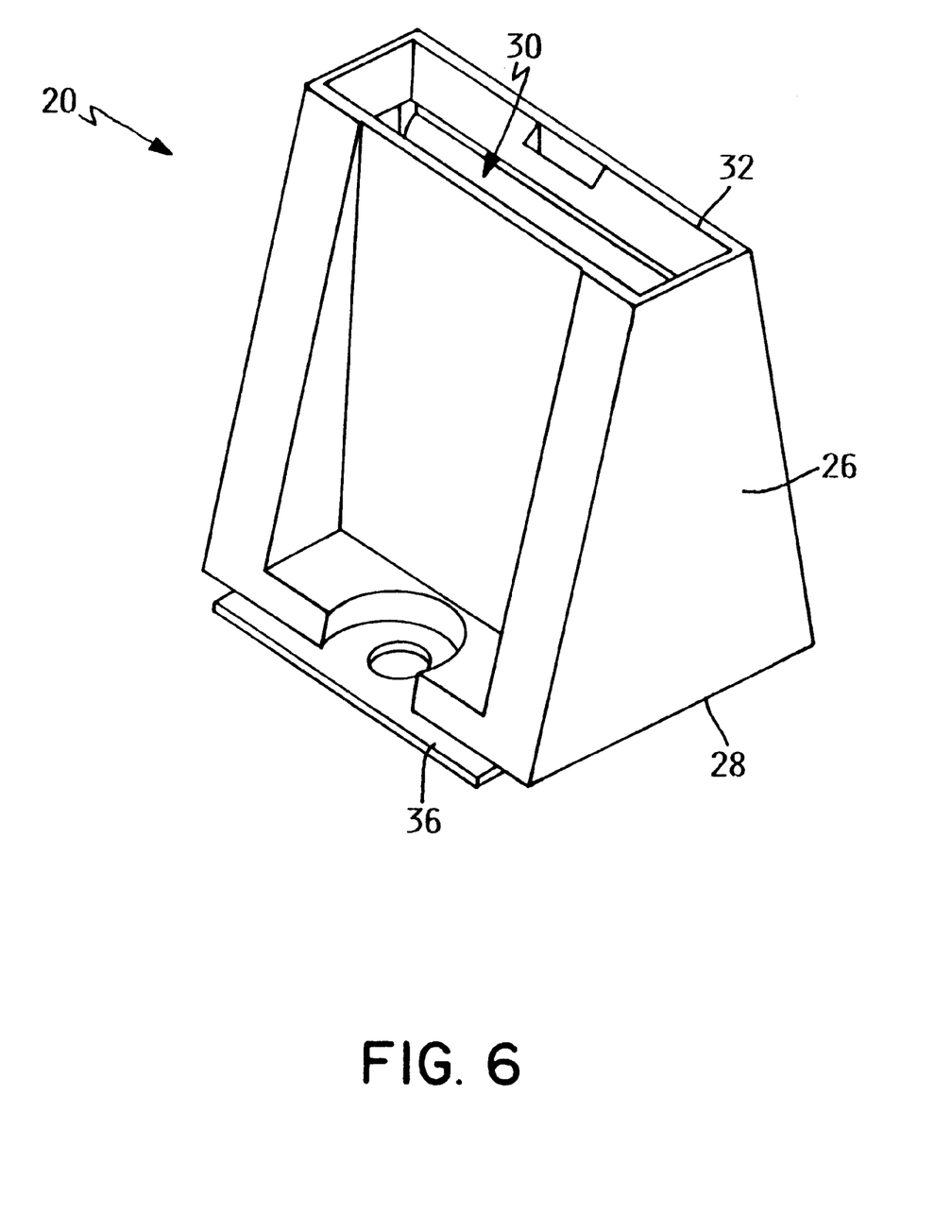
FIGS. 6–8 are various views of a feed through connector used in the enhanced arrangement for supplying continuous power to circuit boards shown in FIG. 1.
Figure 7:
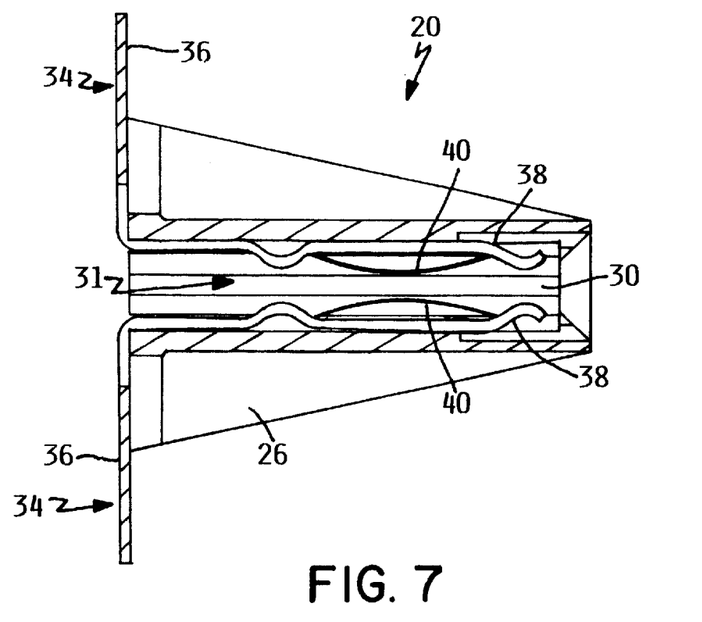
Figure 8:
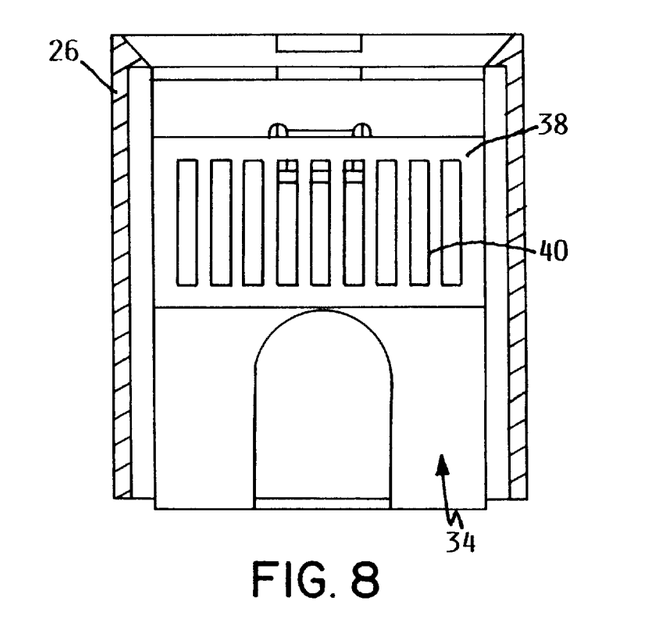

Referring to FIGS. 6–8, in the exemplary embodiment, the feed through connector 20 has a housing 26 formed of an insulating material, for example glass-reinforced polyester. The housing 26 can have a variety of configurations, but in the exemplary illustrated embodiment has an essentially frusto-pyramidal shape. This configuration advantageously provides the feed through connector 20 with a relatively large, flat base 28, so that the feed through connector 20 can be more easily and securely attached to the second flange 18 of the first buss bar 10. Further, the housing 26 has a through hole 30 extending from the base 28 to a top 32 of the housing, and which defines a cavity 31 within the housing. In the exemplary embodiment, the hole 30 and cavity 31 have a profile that corresponds essentially to a cross-sectional profile of the second buss bar 22, and which is sized slightly larger than the cross-sectional profile of the second buss bar to advantageously allow the second buss bar to slide therethrough. The feed through connector 20 further includes at least one conductor member 34 disposed within the cavity 31. In the exemplary illustrated embodiment, the conductor member 34 is an L-shaped metal plate defined by two legs 36, 38 which are essentially perpendicular to each other, and which is formed from copper and/or nickel, for example. One leg 36 of the plate is positioned on the outside of the housing 26, and under the base 28. This arrangement advantageously allows the leg 36 to be easily fastened, for example by bolting, screwing or welding, to the second flange 18 of the first buss bar 10, thus providing for a large area of engagement therebetween. This large area of engagement will thus advantageously have a relatively low impedance.

Further, the other leg 38 is disposed in the cavity 31 and adjacent to an inside wall of the housing 26. Moreover, in the exemplary illustrated embodiment, two conductor members 34 are provided, with their respective legs 38 being disposed on opposite sides of the cavity 31, and separated from each other by a space. Thus, the conductor members 34 are disposed to receive the second buss bar 22 therebetween.

Additionally, in the exemplary embodiment, the two conductor members 34 are not electrically coupled to each other. Thus, if desired, the feed through connector 20 can advantageously be used with the laminated buss bar described above, with one of the conductor members 34 being electrically coupled to one of the layers of the buss bar, and the other one of the conductor members 34 being electrically coupled to another one of the layers of the buss bar. However, a non-laminated buss bar can likewise be used with this arrangement. Moreover, if a non-laminated buss bar is utilized, then it would also be possible to interconnect the two conductor members 34, for example, along the longitudinal edges of the respective legs 38, to form one larger conductor member that would essentially surround a periphery of the buss bar. Other configurations of the conductor member or members are likewise within the scope of the invention. However, in all arrangements, it is preferred that a sliding arrangement is formed between the first buss bar 10, the second buss bar 22, and the feed through connector 20.

In order to ensure a relatively high power transfer through the feed through connector 20, each leg 38 of each respective conductor member 34 is provided with a plurality of resilient conductive contact bands 40, each of which projects into the cavity 31. The contact bands 40 will provide for a relatively large number of A-spots between the feed through connector 20 and the second buss bar 22. In the exemplary embodiment, each conductor member 34 is provided with ten contact bands 40. Of course, this number can be varied without departing from the scope of the present invention.

Moreover, in order to provide for a larger A-spot, each contact band 40 projects into the cavity 31 by a distance sufficient to exert a substantial amount of force (known as a "mating force") against the respective major surfaces of the second buss bar 22, for example, when the second buss bar is inserted into the feed through connector 20. Thus, a distance between contact bands 40 disposed on opposite sides of the cavity 31, for example, is less than a thickness of the associated buss bar. Further, in the exemplary embodiment, the total maximum mating force is about 44 Newtons, for example.

In order to further reduce the impedance and prevent corrosion of the various contacting components, the conductor member 34 may be plated. For example, in the exemplary embodiment, the contact bands 40 and the leg 36 may be gold plated.

Moreover, although the above-described exemplary embodiment of the feed through connector 20 includes an insulator housing 26 having conductor members 34 therein, other configurations of the feed through connector are within the scope of the invention. For example, it may be possible to dispense with the insulator housing 26 and/or the contact bands 40. However, the connector used should allow for a relatively high power transfer from one buss bar to another buss bar, and should allow the buss bars to slide relative to each other while maintaining the high power transfer therebetween.

Referring back to FIGS. 1 and 3–5, the backplane 14 has a number of circuit boards 42 attached thereto. For example, such circuit boards may include a processor card and/or a so-called memory riser card, attached to a common surface of the backplane 14 by way of card slots 44. The arrangement of the backplane 14 and the circuit boards 42 is disposed in a slidable drawer 46, that can be opened to provide access to the various boards and components therein. Further, as is typical, the power supply 12 is provided in a location other than the drawer, for example, in a separate cage disposed within the computer chassis 13. For purposes of clarity, the computer chassis 13 is only shown in FIG. 4. However, it is to be understood that the lower drawer 46 shown in FIGS. 1 and 3–5 is located in a closed position, i.e., set within the chassis or other frame member of the computer, thus preventing access to the boards disposed within the drawer. Further, the upper drawer 46 is illustrated in an opened position. Moreover, in FIG. 3, the upper drawer has been omitted from the drawing, so as to better illustrate the various components disposed therein.

In order to ensure the power supply 12 remains coupled to the backplane 14, for example, when the drawer 46 is open, the first buss bar 10 and second buss bar 22 are advantageously slidable and electrically coupled to each other using the feed through connector 20. In particular, the second buss bar 22 extends entirely through the feed through connector 20 by passing through the cavity 31. When the drawer 46 is in a closed position, the second buss bar 22 will be substantially directly underneath (or over, depending on the orientation) the first buss bar 10. However, when the drawer 46 is slid to an opened position, the second buss bar 22, which is attached to the drawer by way of the backplane 14, for example, will also be slid in a similar direction. Since the first buss bar 10 and the feed through connector 20 are fixed relative to the drawer 46, the second buss bar 22 will thus be slid into an extended position.

The length of the second buss bar 22 is selected to allow for the full opening of the drawer 46 without the end of the second buss bar 22 disengaging with the feed through connector 20. Moreover, the end of the second buss bar 22 may be provided with a projecting stop member (not shown), which may abut against the base 28 of the feed through connector 20 when the second buss bar 22 is fully extended, to prevent the second buss bar from being pulled through the feed through connector.

Figure 9:
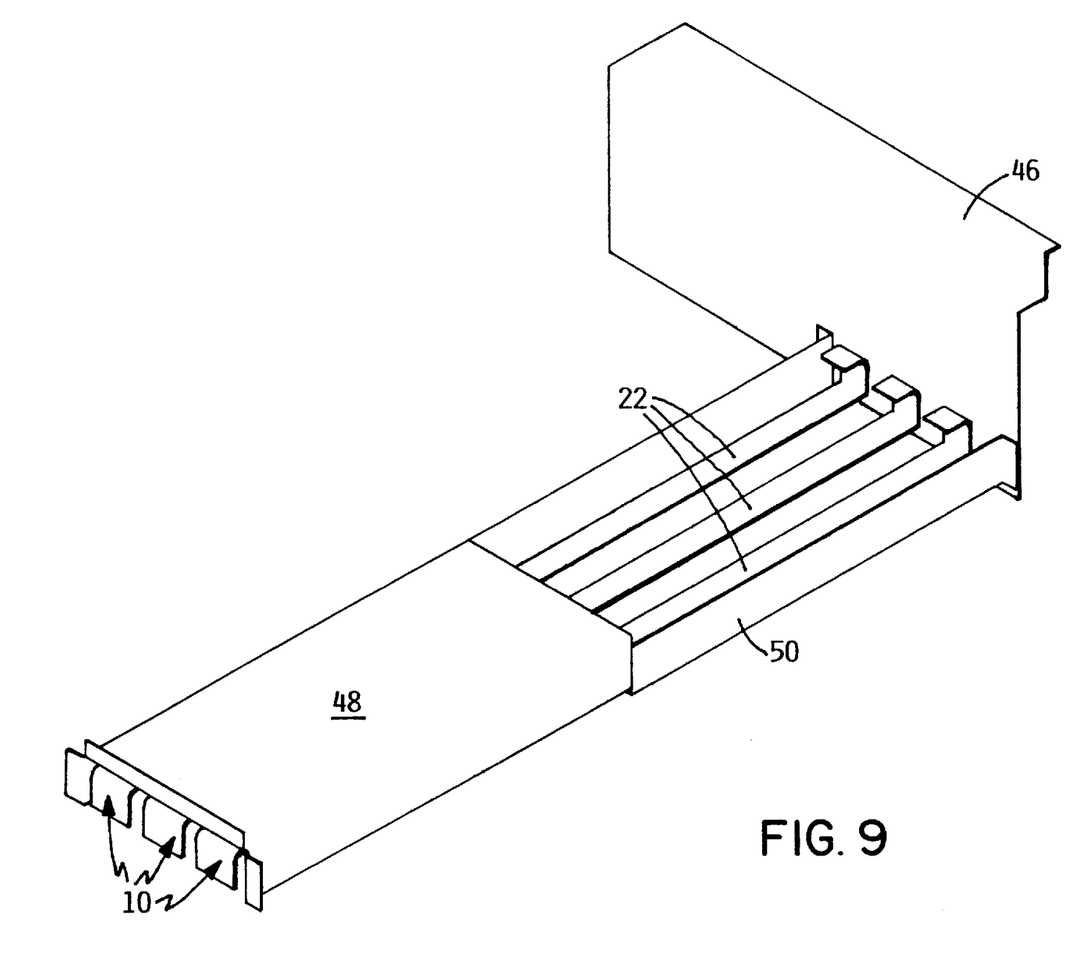
FIGS. 9 and 10 are perspective views of shield panels which may be used to cover the enhanced arrangement for supplying continuous power to circuit boards shown in FIG. 1.
Figure 10:
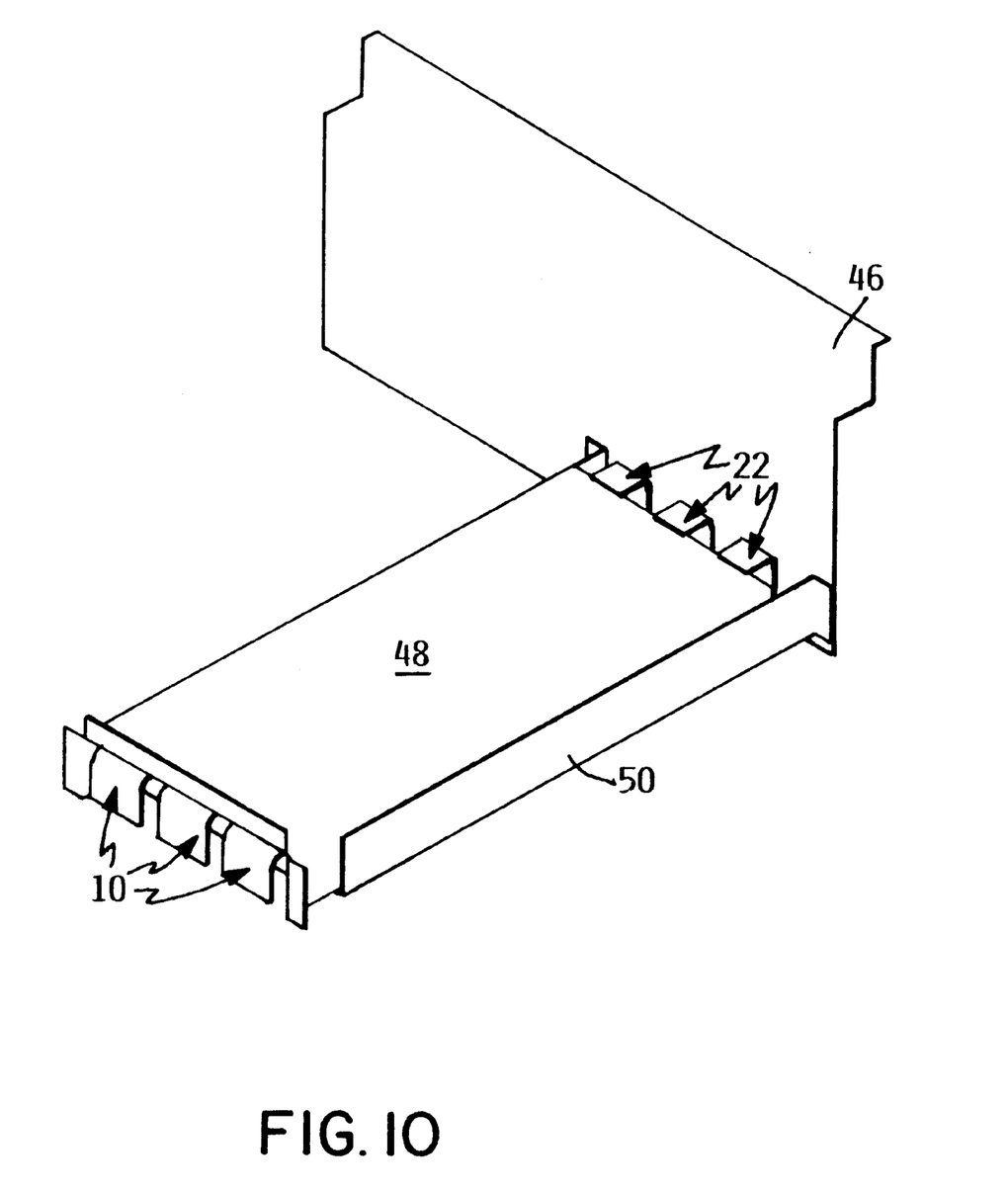

As shown in FIGS. 9 and 10, an upper shield panel 48 and a lower shield panel 50 may be provided, to cover the first buss bar 10 and second buss bar 22. The upper shield panel 48 may be connected to the first buss bar 10 to provide support for the buss bar and the feed through connector 20. Moreover, the shield panels 48, 50 help protect the buss bars 10, 22 from debris. Further, the shield panels 48, 50 may be formed from an insulating material, thus preventing injury to a user or damage to other components due to inadvertent contact with the buss bars 10, 22.

In the exemplary illustrated embodiment, the upper shield panel 48 is connected to the computer chassis (not shown in these figures) in a cantilever manner, and surrounds the upper half of the first buss bar 10, i.e., the upper major surface and the opposing longitudinal edges. Similarly, the lower shield panel 50 is connected to an inside surface of a front of the drawer 46 in a cantilever manner, and surrounds the lower half of the second buss bar 22. When the drawer 46 is closed (as shown in FIG. 10), the upper shield panel 48 nests within the lower shield panel 50 to completely surround the first and second buss bar 10, 22. Alternatively, the upper and lower shield panels 48, 50 can be configured as sleeves (not shown) to completely surround the respective buss bars. Other configurations and arrangements of the shield panels are within the scope of the present invention.

It should be understood, however, that the invention is not necessarily limited to the specific arrangement and components shown and described above, but may be susceptible to numerous variations within the scope of the invention. For example, it may be desirable in certain arrangements to use the feed through connector with only one buss bar, which would function in the same manner as the above-described second buss bar 22. For example, it may be possible to connect the feed through connector directly to the power supply.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. An electrical interface arrangement, comprising:
   a first buss bar; and
   a second buss bar electrically coupled to said first buss bar, said second buss bar being slidable relative to said first buss bar while maintaining an electrical coupling therebetween.

2. The electrical interface arrangement of claim 1, further comprising a power supply, and a circuit board, said first buss bar being electrically coupled to said power supply, and said second buss bar being electrically coupled to said circuit board, wherein said first buss bar and said second buss bar continuously convey power from said power supply to said circuit board when said second buss bar is slid relative to said first buss bar.

3. The electrical interface arrangement of claim 1, further comprising a feed through connector fixed to said first buss bar, said second buss bar extending through the feed through connector, and being slidable relative thereto, wherein said feed through connector electrically couples said first buss bar to said second buss bar as said second buss bar is slid through said feed through connector.

4. The electrical interface arrangement of claim 3, wherein said feed through connector includes a housing having a hole extending therethrough which accommodates the second buss bar, and at least one conductor member disposed within the housing.

5. The electrical interface arrangement of claim 4, wherein said housing has a frusto-pyramidal shape having a base, and wherein said conductor member has first and second legs connected together in an L-shape, the first leg being disposed in the housing, and the second leg being disposed under the base of the housing.

6. The electrical interface arrangement of claim 5, wherein said second leg is electrically fixed to said first buss bar, and said first leg is slidingly coupled to said second buss bar.

7. The electrical interface arrangement of claim 6, wherein said conductor member includes a plurality of conductive contact bands disposed on said first leg, each contact band projecting toward the second buss bar and electrically engaging with the second buss bar.

8. The electrical interface arrangement of claim 6, wherein said at least one conductor member comprises first and second conductor members, and wherein the first leg of the first conductor member is separated from the first leg of the second conductor member by a space, said second buss bar being slidingly disposed in the space.

9. The electrical interface arrangement of claim 3, wherein said first buss bar has a flange at an end thereof, said feed through connector being fastened to said flange.

10. The electrical interface arrangement of claim 9, wherein said flange has an opening therethrough in registration with said feed through connector, said opening accommodating the second buss bar when the second buss bar is slid through said feed through connector.

11. The electrical interface arrangement of claim 1, wherein said second buss bar has an essentially constant cross-sectional profile.

12. The electrical interface arrangement of claim 1, wherein said first buss bar has a width that is greater than said second buss bar.

13. The electrical interface arrangement of claim 1, wherein said first buss bar has guide members that support and guide the second buss bar.

14. A feed through buss bar connector, comprising:
   a housing having a hole that extends therethrough and which defines a space within said housing that accommodates a sliding buss bar; and
   at least one conductor member disposed at least partially within the space and to a side of the hole so as to allow the buss bar to extend entirely through said housing by way of the hole, said conductor member being continuously electrically engageable with the buss bar as the buss bar is slid through said housing.

15. The feed through buss bar connector of claim 14, wherein said housing has a frusto-pyramidal shape having a base, and wherein said conductor member has first and second legs connected together in an L-shape, the first leg being disposed in the housing, and the second leg being disposed under the base of said housing.

16. The feed through buss bar connector of claim 15, wherein said second leg is electrically fixable to a further buss bar, and said first leg is slidingly couplable to the sliding buss bar so as to continuously electrically couple the further buss bar to the sliding buss bar as the sliding buss bar is slid through said housing.

17. The feed through buss bar connector of claim 16, wherein said conductor member includes a plurality of conductive contact bands disposed on said first leg, each contact band projecting into the space defined by the hole for electrically engaging with the sliding buss bar.

18. The feed through buss bar connector of claim 15, wherein said at least one conductor member comprises first and second conductor members, and wherein the first leg of the first conductor member is separated from the first leg of the second conductor member to allow the sliding buss bar to be slidingly disposable therebetween.

19. A computer, comprising:
   a chassis;
   at least one drawer attached to said chassis, said drawer being slidable to an open position in which the drawer is disposed substantially external to said chassis;
   at least one circuit board disposed within said drawer;
   a power supply located external to said drawer; and
   an electrical interface arrangement for conveying power between said power supply and said circuit board, comprising:
      at least one first buss bar electrically coupled to said power supply; and
      at least one second buss bar electrically coupled to said first buss bar and to said circuit board, said first and second buss bars being slidable relative to each other while maintaining an electrical coupling therebetween when said drawer is slid to the opened position.

20. The computer of claim 19, wherein said at least one circuit board comprises a backplane, and at least one of a processor card and a memory riser card attached to a common surface of the backplane.

21. The computer of claim 19, wherein said at least one first buss bar comprises at least two separate first buss bars, and said at least one second buss bar comprises at least two separate second buss bars, one of the first buss bars transferring a first voltage from said power supply to the circuit board by way of one of the second buss bars, and another one of the first buss bars transferring a second voltage that is different from the first voltage, from said power supply to the circuit board by way of another one of the second buss bars.

22. The computer of claim 19, wherein said electrical interface arrangement further comprises a feed through connector fixed to said first buss bar, said second buss bar extending through the feed through connector, and being slidable relative thereto, wherein said feed through connector electrically couples said first buss bar to said second buss bar as said second buss bar is slid through said feed through connector.

23. The computer of claim 22, wherein said feed through connector includes a housing having a hole extending therethrough which accommodates the second buss bar, and at least one conductor member disposed within the housing.

24. The computer of claim 23, wherein said housing has a frusto-pyramidal shape having a base, and wherein said conductor member has first and second legs connected together in an L-shape, the first leg being disposed in the housing, and the second leg being disposed under the base of the housing.

25. The computer of claim 24, wherein said second leg is electrically fixed to said first buss bar, and said first leg is slidingly coupled to said second buss bar.

26. The computer of claim 25, wherein said conductor member includes a plurality of conductive contact bands disposed on said first leg, each contact band projecting toward the second buss bar and electrically engaging with the second buss bar.

27. The computer of claim 26, wherein said at least one conductor member comprises first and second conductor members, and wherein the first leg of the first conductor member is separated from the first leg of the second conductor member by a space, said second buss bar being slidingly disposed in the space.

28. The computer of claim 23, wherein said first buss bar has a flange at an end thereof, said feed through connector being fastened to said flange.

29. The computer of claim 28, wherein said flange has an opening therethrough in registration with said feed through connector, said opening accommodating the second buss bar when the second buss bar is slid through said feed through connector.

30. The computer of claim 19, further comprising a first shield panel covering at least a portion of the first buss bar, and a second shield panel covering at least a portion of the second buss bar, the first and second shield panels nesting together when the drawer is in a closed position.

* * * * *